(12) United States Patent
Kuramoto et al.

(10) Patent No.: US 8,836,130 B2
(45) Date of Patent: Sep. 16, 2014

(54) LIGHT EMITTING SEMICONDUCTOR ELEMENT BONDED TO A BASE BY A SILVER COATING

(75) Inventors: Masafumi Kuramoto, Tokushima (JP); Satoru Ogawa, Anan (JP); Teppei Kunimune, Tokushima (JP)

(73) Assignee: Nichia Corporation, Anan-Shi (JP)

( * ) Notice: Subject to any disclaimer, the term of this patent is extended or adjusted under 35 U.S.C. 154(b) by 10 days.

(21) Appl. No.: 13/333,569

(22) Filed: Dec. 21, 2011

(65) Prior Publication Data

US 2012/0153486 A1 Jun. 21, 2012

Related U.S. Application Data

(63) Continuation-in-part of application No. 12/691,999, filed on Jan. 22, 2010, now Pat. No. 8,679,898.

(30) Foreign Application Priority Data

Jan. 23, 2009 (JP) ................................ 2009-013712

(51) Int. Cl.
| | | |
|---|---|---|
| H01L 23/48 | (2006.01) | |
| H01L 23/52 | (2006.01) | |
| H01L 29/40 | (2006.01) | |
| H01L 21/18 | (2006.01) | |
| H01L 23/00 | (2006.01) | |
| H01L 33/62 | (2010.01) | |

(52) U.S. Cl.
CPC ..... *H01L 21/187* (2013.01); *H01L 2924/01022* (2013.01); *H01L 2924/01045* (2013.01); *H01L 2224/2908* (2013.01); *H01L 2224/32225* (2013.01); *H01L 2924/01038* (2013.01); *H01L 2924/19041* (2013.01); *H01L 2924/1579* (2013.01); *H01L 2924/04941* (2013.01); *H01L 2224/16225* (2013.01); *H01L 2924/01013* (2013.01); *H01L 2224/8383* (2013.01); *H01L 2924/0132* (2013.01); *H01L 2924/01322* (2013.01); *H01L 2224/29111* (2013.01); *H01L 2224/29101* (2013.01); *H01L 2224/83447* (2013.01); *H01L 2924/01064* (2013.01); *H01L 2224/81801* (2013.01); *H01L 2224/83444* (2013.01); *H01L 24/81* (2013.01); *H01L 2924/01006* (2013.01); *H01L 2924/01019* (2013.01); *H01L 2924/01057* (2013.01); *H01L 24/83* (2013.01); *H01L 2924/01063* (2013.01); *H01L 2924/01056* (2013.01); *H01L 2224/05639* (2013.01); *H01L 2924/0104* (2013.01); *H01L 2924/14* (2013.01); *H01L 2924/01025* (2013.01); *H01L 2924/0001* (2013.01); *H01L 2224/83439* (2013.01); *H01L 2924/09701* (2013.01); *H01L 2924/01105* (2013.01); *H01L 2224/16227* (2013.01); *H01L 2924/0103* (2013.01); *H01L 2924/0105* (2013.01); *H01L 2924/01047* (2013.01); *H01L 2224/2919* (2013.01); *H01L 2924/014* (2013.01); *H01L 2924/01005* (2013.01); *H01L 2924/01049* (2013.01); *H01L 2924/01033* (2013.01); *H01L 2924/01082* (2013.01); *H01L 2924/0102* (2013.01); *H01L 2224/83411* (2013.01); *H01L 2924/0665* (2013.01); *H01L 2924/01004* (2013.01); *H01L 2224/29386* (2013.01); *H01L 24/17* (2013.01); *H01L 2224/81894* (2013.01); *H01L 2924/01012* (2013.01); *H01L 2224/13099* (2013.01); *H01L 2924/3025* (2013.01); *H01L 2224/83801* (2013.01); *H01L 2224/29* (2013.01); *H01L 33/62* (2013.01); *H01L 2924/01078* (2013.01); *H01L 2924/01058* (2013.01); *H01L 2924/01024* (2013.01); *H01L 2924/01029* (2013.01); *H01L 2924/01074* (2013.01); *H01L 24/32* (2013.01); *H01L 2924/15787* (2013.01); *H01L 2224/812* (2013.01); *H01L 2924/01079* (2013.01); *H01L 24/29* (2013.01)
USPC ................ 257/762; 257/13; 257/79; 257/99; 257/779; 257/E21.088; 438/26; 438/51; 438/118; 438/455

(58) Field of Classification Search
None
See application file for complete search history.

(56) References Cited

U.S. PATENT DOCUMENTS

| | | | |
|---|---|---|---|
| 3,657,611 A | 4/1972 | Yoneda | |
| 7,276,185 B2 | 10/2007 | Totokawa et al. | |
| 2001/0050370 A1 | 12/2001 | Sakamoto et al. | |
| 2001/0052600 A1 | 12/2001 | Sakamoto et al. | |
| 2002/0117672 A1* | 8/2002 | Chu et al. .................. | 257/79 |
| 2004/0214418 A1 | 10/2004 | Noda et al. | |
| 2006/0065901 A1 | 3/2006 | Aoyagi et al. | |
| 2007/0074391 A1 | 4/2007 | Totokawa et al. | |
| 2007/0079665 A1 | 4/2007 | Sasaki et al. | |
| 2008/0138238 A1 | 6/2008 | Sasaki et al. | |
| 2008/0156398 A1* | 7/2008 | Yasuda et al. .................. | 148/23 |
| 2008/0160183 A1 | 7/2008 | Ide et al. | |
| 2008/0194077 A1 | 8/2008 | Liu et al. | |
| 2009/0025967 A1 | 1/2009 | Boreghda et al. | |

| | | | |
|---|---|---|---|
| 2009/0162557 | A1 | 6/2009 | Lu et al. |
| 2010/0133565 | A1* | 6/2010 | Cho et al. .................. 257/98 |
| 2010/0190296 | A1 | 7/2010 | Kuramoto et al. |

FOREIGN PATENT DOCUMENTS

| | | | |
|---|---|---|---|
| EP | 0 269 294 A1 | 6/1988 | |
| EP | 1 950 767 A1 | 7/2008 | |
| JP | 6-4790 A | 1/1994 | |
| JP | 6-302213 A | 10/1994 | |
| JP | 8-148512 A | 6/1996 | |
| JP | 10-284516 A | 10/1998 | |
| JP | 10-308120 A | 11/1998 | |
| JP | 11-111052 A | 4/1999 | |
| JP | 2001-216839 A | 8/2001 | |
| JP | 2001-325831 A | 11/2001 | |
| JP | 2002-64225 A | 2/2002 | |
| JP | 2003-309352 A | 10/2003 | |
| JP | 2004-128330 A | 4/2004 | |
| JP | 2004-143325 A | 5/2004 | |
| JP | 2004-253251 A | 9/2004 | |
| JP | 2004-362960 A | 12/2004 | |
| JP | 2005-48236 A | 2/2005 | |
| JP | 2005-48237 A | 2/2005 | |
| JP | 2005-93380 A | 4/2005 | |
| JP | 2005-129303 A | 5/2005 | |
| JP | 2005-126726 A | 6/2005 | |
| JP | 2005-200604 A | 7/2005 | |
| JP | 2005-267900 A | 9/2005 | |
| JP | 2006-24808 A | 1/2006 | |
| JP | 2006-100500 A | 4/2006 | |
| JP | 2006-237141 A | 9/2006 | |
| JP | 2007-42301 A | 2/2007 | |
| JP | 2007-53212 A | 3/2007 | |
| JP | 2007-184153 A | 7/2007 | |
| JP | 2007-258647 A | 10/2007 | |
| JP | 2007-302953 A | 11/2007 | |
| JP | 2008-208442 A | 9/2008 | |
| JP | 4-347381 A | 10/2009 | |
| WO | WO 2006/126614 A1 | 11/2006 | |
| WO | WO 2007/034833 A1 | 3/2007 | |
| WO | WO 2010/084746 A1 | 7/2010 | |

OTHER PUBLICATIONS

Japanese Information Offer Form dated Apr. 27, 2011 for Japanese Application No. 2009-13711.

Li et al., "Recent advances of conductive adhesives as a lead-free alternative in electronic packaging; Materials, processing, reliability and applications," Materials Science and Engineering, R 51, 2006, pp. 1-35.

Masafumi Kuramoto et al., "Low-Temperature and Pressureless Ag-Ag Direct Bonding for Light Emitting Diode Die-Attachment", published on Jan. 23, 2012, vol. 99, IEEE Transactions on Components, Packaging and Manufacturing Technology. ISSN 2156-3950, pages unknown.

Masafumi Kuramoto, "Research on Die-Attach Material for Light-Emitting Diodes Using Low-Temperature Sintering of Micro-Sized Silver Particles", Presented on Dec. 22, 2010, Department of Adaptive Machine Systems, Graduate School of Engineering, Osaka University [Dissertation Presentation Theme of Presentation: Power Point].

Masafumi Kuramoto, "Research on Die-Attach Material for Light-Emitting Diodes Using Low-Temperature Sintering of Micro-Sized Silver Particles". Published on Apr. 18, 2011, Ph. D. Program at Department of Adaptive Machine Systems, Graduate School of Engineering, Osaka University.

Chinese Office Action issued on Dec. 26, 2013 in corresponding Application No. 201080005218.6.

Morita et al. "Bonding Technique Using Micro-Scaled Silver-Oxide Particles for In-Situ Formation of Silver Nanoparticles"; Materials Transactions; 2008 The Japan Institute of Metals; vol. 49, No. 12 (2008); pp. 2875-2880.

EP Search Report dated May 25, 2012, issued in corresponding European patent application No. 10733354.4.

* cited by examiner

*Primary Examiner* — Marcos D. Pizarro
*Assistant Examiner* — Cesar Lopez
(74) *Attorney, Agent, or Firm* — Birch, Stewart, Kolasch & Birch, LLP

(57) ABSTRACT

An object of the invention is to provide a method for producing a conductive member having low electrical resistance, and the conductive member is obtained using a low-cost stable conductive material composition that does not contain an adhesive. In the semiconductor device, silver arranged on a semiconductor element and silver arranged on a base are bonded. No void is present or a small void, if any, is present at an interface between the semiconductor element and the silver arranged on the semiconductor element, no void is present or a small void, if any, is present at an interface between the base and the silver arranged on the base, and one or more silver abnormal growth grains and one or more voids are present in a bonded interface between the silver arranged on the semiconductor element and the silver arranged on the base.

10 Claims, 5 Drawing Sheets

LIGHT EMITTING SEMICONDUCTOR ELEMENT BONDED TO A BASE BY A SILVER COATING

CROSS-REFERENCE TO RELATED APPLICATIONS

This non-provisional application is a Continuation-in-Part under 35 U.S.C. §120of co-pending Application No. 12/691,999 filed on Jan. 22, 2010, which claims foreign priority to Application No. 2009-013712 filed in Japan on Jan. 23, 2009. The entire contents of all of the above applications are hereby incorporated by reference.

BACKGROUND OF THE INVENTION

1. Field of the Invention

The present invention relates to a semiconductor device and a production method therefor, especially, a method for bonding a semiconductor element (hereinafter sometimes referred to as a "die-attach method").

2. Description of Related Art

Various bonding methods for mounting semiconductor elements such as transistors, ICs, and LSIs have been known. In addition, various bonding methods that are suitable with, among semiconductor elements, light emitting semiconductor elements such as light emitting diodes (hereinafter sometimes referred to as "LEDs") and laser diodes (hereinafter sometimes referred to as "LDs") have been know as well.

Conventionally, die-attach methods for semiconductor elements are roughly classified into two categories, i.e., bonding methods that use epoxy resin adhesives (hereinafter referred to as "resin bonding") and bonding methods that use eutectic metals having an eutectic point at a high temperature of 300° C. or greater (hereinafter referred to as "eutectic bonding") (see, for example, Patent Documents 1 and 2). Such die-attach methods are selected according to the similarity between the thermal expansion behaviors of a lead frame material and a substrate material on which a semiconductor element is to be mounted, as well as the reliability, cost, and like factors. For example, resin bonding is used for light emitting diodes for use in liquid-crystal back lights of small portable devices and like devices whose cost is given priority, and eutectic bonding is generally used for light emitting diodes for lighting purposes that are required to last a long time and for laser diodes that are required to be highly reliable.

A resin for use in resin bonding is mostly a thermosetting resin such as an epoxy resin. A paste in which a powder of a conductive material such as silver is dispersed is also a type of resin for resin bonding. In resin bonding, a liquid epoxy resin is heated to 150 to 200° C. for curing. Resin bonding is convenient in that curing can be readily accomplished at low temperatures of 150 to 200° C. In particular, thermal degradation of the thermosetting resin and melting of the thermoplastic resin can be avoided in a general-purpose surface-mounted semiconductor device in which a lead frame is molded in advance.

However, the heat generation due to the recent increase of light energy attained by light emitting diodes, laser diodes and like devices as well as the recent increase in input electricity, causes the resin itself that is used in resin bonding to deteriorate with time, resulting in problems such as discoloration and deterioration of the bonding strength. The glass transition temperature, which is an indicator in terms of temperature of the modulus of elasticity of a resin, is, because curing is performed at a low temperature, lower than the solder mounting temperature applied when a semiconductor device is mounted as an electronic component, and thus separation resulting from deterioration of the resin strength caused by thermal shock during solder mounting is likely to occur. Moreover, resin bonding that uses only an epoxy resin and resin bonding that uses a silver paste both have a problem in that, since they have poor thermal conductivity and insufficient heat releasability, light emitting diodes and the like become unilluminable.

On the other hand, eutectic bonding that uses an alloy of gold and tin can solve the aforementioned problems of resin bonding.

However, eutectic bonding requires heating to 300° C. or greater when bonding, and is therefore not applicable to widely used resin packages of PPA (polyphthalamide) or the like since such packages cannot withstand high temperatures. In addition, even if silver plating, which has high light reflectivity, is provided over the surface of a wiring board or a lead frame on which a light emitting diode is to be mounted, light extraction effect cannot be enhanced since eutectic metals have poor reflectivity.

Patent Document 1: JP 2004-128330 A
Patent Document 1: JP 2006-237141 A

SUMMARY OF THE INVENTION

Therefore, with the foregoing in mind, it is an object of the present invention to provide a method for mounting a reliable semiconductor element and to provide a method for mounting a semiconductor element that has high heat releasability. Accordingly, a low-cost semiconductor device and a simple production method of a semiconductor device can be provided.

The present invention relates to a semiconductor device in which silver arranged on a semiconductor element and silver arranged on a base are bonded. No void is present or a small void, if any, is present at an interface between the semiconductor element and the silver arranged on the semiconductor element, no void is present or a small void, if any, is present at an interface between the base and the silver arranged on the base, and one or more silver abnormal growth grains and one or more voids are present in a bonded interface between the silver arranged on the semiconductor element and the silver arranged on the base.

In the semiconductor device of the present invention, the total area of the one or more voids in the bonded interface between the silver arranged on the semiconductor element and the silver arranged on the base is preferably 80% or less, more preferably 65% or less, and even more preferably 55% or less of the total area of the bonded interface, where the total area of the bonded interface is 100%.

Further, the present invention relates to a method for producing a semiconductor device in which silver provided on a surface of a base and silver provided on a surface of a semiconductor element are bonded. The method comprises the steps of: applying an organic solvent or water between the silver provided on the surface of the semiconductor element and the silver provided on the surface of the base, arranging the semiconductor element on the base such that the silver provided on the surface of the semiconductor element is in contact with the silver provided on the surface of the base, and bonding the semiconductor element and the base by applying heat having a temperature of 200 to 260° C. for 1 to 2 hours to the semiconductor element and the base. It is thus possible to provide a method for producing a reliable semiconductor device since components that are likely to deteriorate are not used. Moreover, since the semiconductor element and the base are directly bonded, the thermal conductivity is high and the heat generated by the semiconductor element can be efficiently transferred to the base. Furthermore, the semiconductor element can be mounted without special equipment, so a simple production method for a semiconductor device can be provided.

While a resin adhesive, a silver paste, a eutectic metal, or the like is present between the base and the semiconductor element in conventional bonding such as resin bonding and eutectic bonding, the base and the semiconductor element are directly bonded in the present invention. A eutectic component that uses an alloy of gold and tin or a component such as an epoxy resin or a silver paste is not present between the semiconductor element and the base, and it is thus possible to provide a reliable semiconductor device.

The temperature for the bonding is in a range of 200 to 260° C., and preferably in a range of 240 to 250° C.

The organic solvent preferably has a boiling point of 100 to 300° C.

The step of bonding is preferably performed in air or in an oxygen environment.

A light emitting semiconductor element can also be used for the semiconductor element.

The semiconductor element used may be a semiconductor element in which a semiconductor layer is disposed on a translucent inorganic substrate, the translucent inorganic substrate is provided with first silver on the side opposite to the semiconductor layer and furnished with a buffering member bonded with the first silver, and the aforementioned silver is provided on a surface of the buffering member.

By adopting the above-described configuration, a low-cost reliable semiconductor device that does not include components that undergo deterioration and a production method therefor can be provided. Moreover, since the semiconductor element and the base can be directly bonded, a semiconductor device with high heat releasability can be provided. Furthermore, a simple production method for a semiconductor device can be provided.

DETAILED DESCRIPTION OF THE INVENTION

Figure 1:
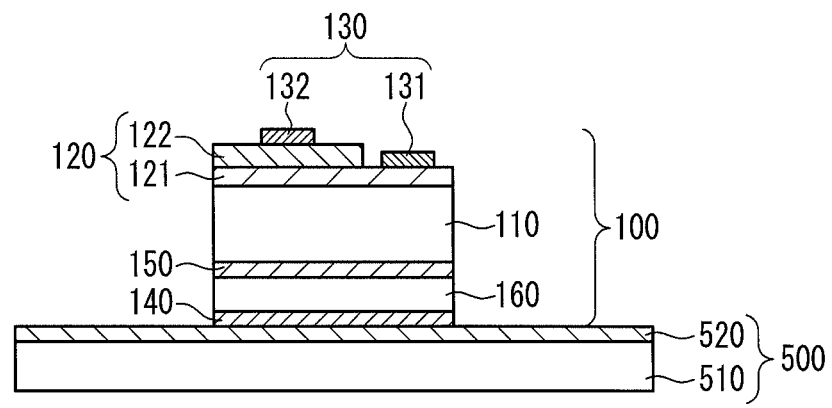
FIG. 1 is a schematic cross-sectional drawing showing the semiconductor light emitting element of the first reference embodiment when mounted.

The inventors found that when a composition containing silver particles having an average particle diameter of 0.1 to 15 µm is sintered in the presence of a metal oxide or in an oxygen or ozone environment or in air, which serves as an oxidizer, silver particles are fused even at a temperature, for example, near 150° C. and a conductive material can be obtained. In contrast, when a composition containing silver particles having an average particle diameter of 0.1 to 15 µm is sintered in a nitrogen environment, no conductive material was obtained at a low temperature near 150° C. Based on these findings, the inventors accomplished a method for producing a conductive material that includes the step of sintering a composition containing silver particles having an average particle diameter of 0.1 to 15 µm in the presence of a metal oxide or in an oxygen or ozone environment or in air, which serves as an oxidizer.

Furthermore, the inventors, during the process of investigating the mechanism of the present invention in detail, performed low-temperature bonding of smoothed silver-sputtered surfaces in the presence of oxygen to examine the bondability of silver surfaces that are not organically contaminated, and found that, even if silver particles are not used, sufficient bonding can be attained by applying heat having a temperature of 200° C. or greater. The inventors applied this finding to develop a highly reliable semiconductor device and have arrived at the present invention. The inventors found at the same time that it is useful also as a method for providing a low-cost semiconductor device.

In the die-attach method of the present invention, the mechanism of bond formation is not clear, but it can be presumed to be as follows. When silver-coated surfaces formed by silver sputtering, silver vapor deposition, silver plating, or a like technique are brought into contact in an oxygen or ozone environment or in air that serves as an oxidizer, some portions of the silver-coated surfaces are locally oxidized, and the silver oxide formed by the oxidation exchanges oxygen in a catalyst-like manner at the places of contact on the silver coated surfaces, and through repetitive redox reactions, bonds are formed. Moreover, it is also presumed that bonds are formed through the same mechanism also in an inert gas atmosphere by forming silver oxide in advance by oxidizing the silver-coated surfaces. Bonds are presumably formed through such a mechanism, and it is therefore possible to provide a highly reliable low-cost semiconductor device when a semiconductor device is produced according to the die-attach method of the present invention.

The present invention relates to a method for producing a semiconductor device. The method comprises the steps of: applying an organic solvent or water between the silver provided on the surface of the semiconductor element and the silver provided on the surface of the base, arranging the semiconductor element on the base such that the silver provided on the surface of the semiconductor element is in contact with the silver provided on the surface of the base, and bonding the semiconductor element and the base by applying heat having a temperature of 200 to 260° C. for 1 to 2 hours to the semiconductor element and the base. The production method of the present invention can impart high emission efficiency to a semiconductor device that uses a light emitting semiconductor element such as a light emitting diode and a laser diode. Since no bonding material is interposed, low electrical resistance and low thermal resistance are attained, and it is thus possible to provide enhanced reliability. Moreover, since bonding can be performed in the same temperature range as in resin bonding, thermal deterioration of the plastics components used in the semiconductor device can be avoided. Since no resin is used in the bonding components, the life of the semiconductor device is extended. Furthermore, since the production process is simple and the amount of noble metal used is extremely low, a semiconductor device can be produced inexpensively.

A lead frame or an organic or inorganic substrate furnished with a metallic wiring can be used as the base, and the surface of the lead frame or the surface of the metal wiring is coated with silver. Irrespective of conductive portions or insulative portions, the surface to be bonded of the semiconductor element is silver-coated as with the base.

A temperature of 200 to 260° C. is applied to the base and the semiconductor element to increase the number of bonding points and to mutually diffuse silver, thereby enabling strong bonding to be attained. Since metal diffusion is obtained as a function of temperature, the bonding strength can be enhanced faster as the temperature is higher. For the lower-limit temperature, 200° C. or a higher temperature is needed to obtain strong bonding within a practical time span.

Heating to 200° C. or greater is needed to attain bonding merely by mounting. The upper limit may be 260° C. Hence, although the semiconductor element and the base can be bonded by applying heat having a temperature of to 200 to 260° C. to the semiconductor element and the substrate, it is preferable to apply heat having a temperature of 240 to 250° C.

The method further includes the step of applying an organic solvent or water between the silver provided on the surface of the semiconductor element and the silver provided on the surface of the base. Before the semiconductor element is mounted on the base, an organic solvent or water may be applied to the base and then the semiconductor element may be mounted thereon. It is thereby possible due to the surface tension of the organic solvent or water to keep the mounted semiconductor element being accurately positioned until the subsequent bonding step.

The organic solvent preferably has a boiling point of 100 to 300° C. This is because an organic solvent having a boiling point of 100° C. or greater does not easily evaporate and the mounted semiconductor element can readily be kept accurately positioned. The boiling point preferably is lower than the heating temperature because organic solvent remaining after the subsequent bonding step results in defective bonding, and the boiling point is thus specified as 300° C. or less to promptly volatilize it without thermal decomposition.

For the present invention, the step of bonding is preferably performed in air or in an oxygen environment. Thereby, an increase in the number of bonding points and, hence, an enhancement of bonding strength can be expected. In particular, the bonding environment for silver-silver bonding is preferably an oxidizing environment containing oxygen or ozone, and more preferably air, which is inexpensive. When performing the step of bonding in an oxidized environment containing oxygen, the oxygen concentration is preferably 0.5 to 100%, and more preferably 0.5 to 20%.

The bonding step is not necessarily composed of a single stage, and may be composed of multiple stages in which the temperature is gradually increased or repetitively increased and decreased.

The semiconductor element used may be a semiconductor element in which a semiconductor layer is disposed on a translucent inorganic substrate, the translucent inorganic substrate is provided with first silver on the side opposite to the semiconductor layer and furnished with a buffering member bonded with the first silver, and the aforementioned silver is provided on a surface of the buffering member.

The present invention relates to a semiconductor device having a die shear strength of 13 to 145 MPa in which silver provided on a surface of a base and silver provided on a surface of a semiconductor element are directly bonded. The die shear strength is dependent on the heating temperature and the heating time during bonding, and the higher the temperature and the longer the time, the higher the strength, but the lower the temperature and the shorter the time, the more advantageous it is when the production costs and the oxidative degradation of plastic components used in the semiconductor device are taken into consideration. Therefore, the die shear strength can be controlled by suitably selecting a heating time. Practically, the semiconductor device needs to withstand a ultrasonic shock during wire bonding and a thermal shock test performed thereon, and a die shear strength of 13 MPa or greater is required. To secure the reliability of the semiconductor device and to lessen the deterioration of the initial properties thereof, the die shear strength is more preferably 100 MPa to 145 MPa.

A light emitting semiconductor element can be used for the semiconductor element. Silver reflects more visible light than any other metal, and providing a silver coating on a surface of the semiconductor element also serves to furnish the semiconductor element with a high-efficiency reflector, creating a configuration highly suitable in a light emitting semiconductor element. Moreover, providing a silver coating on a surface of the base allows the entire semiconductor device to have a reflector-like structure, and it is thus possible to extract light even more efficiently. The translucent inorganic substrate used in the light emitting semiconductor element, since it absorbs very little light, can contribute to producing a light emitting semiconductor element that has a high emission efficiency. In the light emitting semiconductor element, a light emitting layer that is a semiconductor layer is formed on the upper surface of the translucent inorganic substrate, the light emitting semiconductor element is arranged such that the light emitting layer becomes the upper surface, and the under surface on the opposite side of the translucent inorganic substrate is provided with silver. It is thus possible to highly efficiently reflect the light emitted from the light emitting layer and to obtain a semiconductor device having a large emission intensity.

In the semiconductor element, the semiconductor layer is disposed on the translucent inorganic substrate, and the translucent inorganic substrate is provided with first silver on the side opposite to the semiconductor layer. It may also be possible to use a semiconductor element including a buffering member bonded to the first silver, the buffering member being provided with silver. Formation of the first silver between the buffering member and the translucent inorganic substrate can enhance the light reflectivity and thus enhance the emission intensity of the semiconductor device because silver has higher reflectance than the buffering member. One or more layers of the buffering member are provided between the first silver and the outermost silver. Various buffering members can be selected according to the material of the base and the material of the translucent inorganic substrate, and various inorganic materials and various organic materials can be used. Use of the buffering member reduces or alleviates the stress generated between the translucent inorganic substrate and the base, and it is thus possible to enhance bonding reliability and prevent cracks in the translucent inorganic substrate.

Semiconductor Device

Semiconductor Device of First Reference Embodiment

An example of the semiconductor device of the first reference embodiment is described with reference to a drawing. FIG. 1 is a schematic cross-sectional drawing showing the semiconductor light emitting element of the first reference embodiment when mounted. A description is given with reference to a light emitting semiconductor element that uses a light emitting diode as a semiconductor element, but the present invention is applicable also to transistors, ICs, LSIs, and the like other than light emitting semiconductor elements.

In the semiconductor device, silver or silver oxide 520 provided on a surface of a base 500 and silver or silver oxide 140 provided on a surface of a light emitting semiconductor element 100 are directly bonded.

The light emitting semiconductor element 100 includes a translucent inorganic substrate 110, a semiconductor layer 120 that emits light, electrodes 130 disposed on the semiconductor layer 120, first silver 150 provided on the side opposite to the side on which the semiconductor layer 120 is disposed, a buffering member 160 bonded with the first silver, and the silver or silver oxide 140 provided on a surface of the buffering member. In the semiconductor layer 120, an n-type semiconductor layer 121 is stacked on the translucent inorganic substrate 110 and a p-type semiconductor layer 122 is stacked on the n-type semiconductor layer 121. In the electrodes 130, an n-type electrode 131 is disposed on the n-type semiconductor 121, and a p-type electrode 132 is disposed on the p-type semiconductor 122. The light emitting semiconductor element 100 employs a face up structure that has the n-type electrode 131 and the p-type electrode 132 on the same side opposite to the translucent inorganic substrate 110 and is mounted such that electrodes are above the translucent inorganic substrate. One or more layers of the silver or silver oxide 140 may be provided on a surface of the light emitting semiconductor element 100. Moreover, the thickness of the silver or silver oxide 140 provided on a surface of the light emitting semiconductor element 100 is not particularly limited, but preferably is about 0.1 to 50 µm. It is preferable to provide the first silver 150 to efficiently reflect the light from the semiconductor layer 120. The thickness of the first silver 150 can be suitably selected insofar as 85% or greater and preferably 90% or greater of light can be reflected, e.g., 0.05 µm or greater.

The buffering member 160 can reduce or alleviate the bonding stress generated due to the difference between the mechanical properties of the translucent inorganic substrate 110 and the base 500. Various inorganic materials and organic materials can be used for the buffering member 160, and multiple layers of such materials may be formed. A great reduction in the stress that is generated during bonding can be expected with the use of an organic polymeric material for the buffering member 160. Lest the exposed end portions of the buffering member 160 undergo photodegradation, an inorganic material is more preferable.

The silver or silver oxide 140 can be disposed below the buffering member 160, thereby allowing it to be bonded with the silver or silver oxide 520 provided on a surface of the base 500. For the silver and silver oxide 140, use of silver oxide allows bonding to be accomplished in an inert gas environment. Moreover, use of silver oxide can prevent sulfuration and give storage stability to the light emitting semiconductor element before being bonded. Silver oxide can be provided in such a manner that, first, silver is applied to the buffering member 160 and then oxidized by oxygen plasma, UV irradiation, or a like technique, thereby giving silver oxide.

Note that, the silver or silver oxide 140 may be provided directly on the translucent inorganic substrate 110. Furthermore, the silver or silver oxide 140 is not necessarily provided in the form of a single layer and may be provided in the form of multiple layers composed of two or more layers. Using the silver or silver oxide 140 in different thicknesses or compositions, the bondability with the translucent inorganic substrate 110 can be enhanced.

In the base 500, the silver or silver oxide 520 is provided on a surface of a pedestal 510. The pedestal 510 may be conductive or insulative. An example of a conductive member used for the pedestal 510 includes a lead frame made of copper, iron, or a like material. If silver is used for the pedestal 510, it is not necessary to provide the silver or silver oxide 520 and the pedestal 510 serves as the base 500.

On the other hand, examples of an insulative member used for the pedestal 510 include a glass epoxy board, a resin component such as polyphthalamide or a liquid-crystal polymer, a ceramics component, and a like material. In the case where such an insulative member is used for the pedestal 510, desired circuit wiring is installed on a glass epoxy board and the silver or silver oxide 520 is provided on the circuit wiring.

For the silver and silver oxide 520 to be disposed on the pedestal 510, use of silver oxide allows bonding to be accomplished in an inert gas environment. Silver oxide can be provided in such a manner that, first, silver is applied to the pedestal 510 and then oxidized by oxygen plasma, UV irradiation, or a like technique, thereby giving silver oxide. Only a portion on which the light emitting semiconductor element 100 is to be mounted may be oxidized.

The base 500 can take a variety of shapes such as a flat plate shape and a cup shape. For the ease of mounting the light emitting semiconductor element 100, a base 500 in the shape of a flat plate is preferable. To enhance the efficiency of extracting light from the light emitting semiconductor element 100, the base 500 can take the shape of a cup. In the case where the base 500 is cup-shaped, part of the conductive wiring can be exposed exterior of the base 500 as a terminal. Semiconductor light emitting elements having the same function and semiconductor elements having different functions can be mounted on the base 500. An electronic element such as a resistive element and a capacitor may also be mounted on the base 500.

Wiring with a gold wire or the like is provided on the electrode 130 disposed on the light emitting semiconductor element 100 to attain a desired electrical connection. The light emitting semiconductor element 100 is encapsulated in an encapsulating member that contains a fluorescent material, a filler, a light diffusing member, or the like that absorbs the light emitted from the light emitting semiconductor element 100 and converts the wavelength thereof into a different wavelength, thereby giving a semiconductor device.

Method for Producing Semiconductor Device

The light emitting semiconductor element 100 is mounted on the base 500 such that the silver or silver oxide 140 provided on a surface of the light emitting semiconductor element 100 is brought into contact with the silver or silver oxide 520 provided on a surface of the base 500. No solder, resin, or the like is present between the silver or silver oxide 520 provided on a surface of the base 500 and the silver or silver oxide 140 provided on a surface of the light emitting semiconductor element 100. In the base 500, the pedestal 510 is provided with desired circuit wiring, and the silver or silver oxide 520 is provided on the outermost surface of the circuit wiring. In connection with the positioning of the light emitting semiconductor element 100, the circuit wiring may have various shapes, for example, circuit wiring having a shape identical to the contour of the light emitting semiconductor element 100 can be formed, circuit wiring having a shape slightly smaller than but approximately identical to the contour of the light emitting semiconductor element 100 can be formed, or approximately square circuit wiring whose vertices extend to the four corners of the light emitting semiconductor element 100 can be formed.

The light emitting semiconductor element 100 and the base 500 are bonded by applying heat having a temperature of 200 to 900° C. to the light emitting semiconductor element 100 and the base 500. The temperature applied to the light emitting semiconductor element 100 and the base 500 preferably is 250° C. or greater at which strong bonding can be attained. The temperature is not particularly limited insofar as the light emitting semiconductor element 100 can withstand the heat, and it may be no greater than 900° C., which is lower than the melting point of silver, and no greater than 400° C. or less is preferable. Moreover, a temperature of no greater than 350° C., which the light emitting semiconductor element 100 and a packaging can withstand, is particularly preferable. The bonding step can be performed also in air or in an oxygen environment. In the case where the silver 140 is used on a surface of the light emitting semiconductor element 100 and the silver 520 is used on a surface of the base 500, bonding is performed in an oxygen environment. In the case where the silver 140 is used on a surface of the light emitting semiconductor element 100 and the silver oxide 520 is used on a surface of the base 500 and in the case where the silver oxide 140 is used on a surface of the light emitting semiconductor element 100 and the silver or silver oxide layer 520 is used on a surface of the base 500, bonding in both cases can be performed in an inert gas environment such as a nitrogen environment, and it can be performed also in air or in an oxygen environment. Although a longer duration is more preferable, the necessary duration of the step of bonding is also not particularly limited and about 30 minutes to 24 hours is sufficient.

Note that, since the melting point of silver is 961° C., sintering is performed in the present production process at a temperature of no greater than 900° C., which is lower than the melting point of silver, and a temperature of 200 to 400° C. in particular is a very low temperature.

After the light emitting semiconductor element 100 is mounted on the base 500, wires are connected and encapsulation in an encapsulating member is performed, thereby giving a semiconductor device.

Semiconductor Device of Second Reference Embodiment

Figure 2:
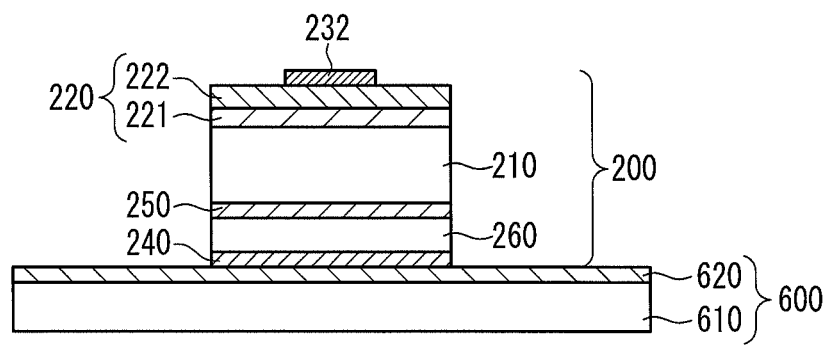
FIG. 2 is a schematic cross-sectional drawing showing the semiconductor light emitting element of the second reference embodiment when mounted.

An example of the semiconductor device of the second reference embodiment is described with reference to a drawing. FIG. 2 is a schematic cross-sectional drawing showing the semiconductor light emitting element of the second reference embodiment when mounted. The semiconductor device of the second reference embodiment has substantially the same configuration as the semiconductor device of the first reference embodiment except for the light emitting semiconductor element, and some descriptions may be omitted.

In the semiconductor device, silver or silver oxide 620 provided on a surface of a base 600 and silver or silver oxide 240 provided on a surface of a light emitting semiconductor element 200 are bonded.

The light emitting semiconductor element 200 includes a translucent inorganic substrate 210, a semiconductor layer 220 that emits light, a p-type electrode 232 disposed on the semiconductor layer 220, first silver 250 provided on the side opposite to the side on which the semiconductor layer 220 is disposed, a buffering member 260 bonded with the first silver 250, and the silver or silver oxide 240 provided on a surface of the buffering member 260. The bottom part of the translucent inorganic substrate 210 serves as an n-type electrode. In the semiconductor layer 220, an n-type semiconductor layer 221 is stacked on the translucent inorganic substrate 210 and a p-type semiconductor layer 222 is stacked on the n-type semiconductor layer 221. The light emitting semiconductor element 200 includes the n-type electrode on the lower-surface side (bottom part of the translucent inorganic substrate 210) and the p-type electrode 232.

In the base 600, the silver or silver oxide 620 is provided on a conductive or insulative pedestal 610.

In this manner, even for the light emitting semiconductor element 200, which has such a configuration that the electrodes are disposed on the upper and lower surfaces, the silver or silver oxide layer 620 provided on the base 600 can be firmly bonded under specific conditions with the silver or silver oxide layer 240 by providing the silver or silver oxide layer 240 on the outermost lower surface of the light emitting semiconductor element 200 on which mounting is performed.

Semiconductor Device of Third Reference Embodiment

Figure 3:
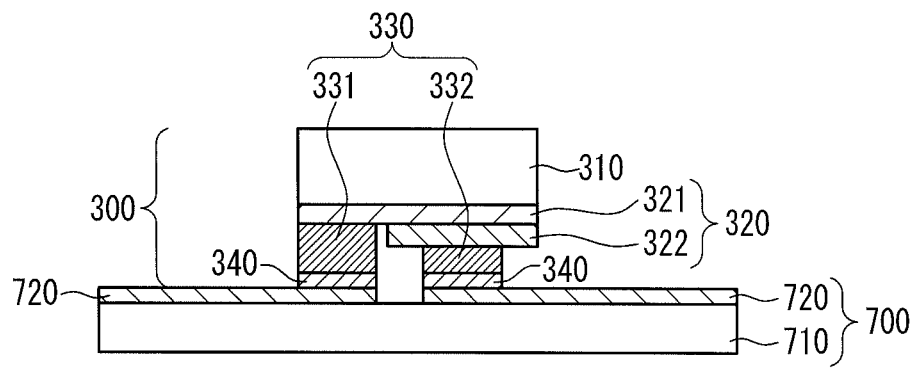
FIG. 3 is a schematic cross-sectional drawing showing the semiconductor light emitting element of the third reference embodiment when mounted.

An example of the semiconductor device of the third reference embodiment is described with reference to a drawing. FIG. 3 is a schematic cross-sectional drawing showing the semiconductor light emitting element of the third reference embodiment when mounted. The semiconductor device of the third reference embodiment have substantially the same configuration as the semiconductor device of the first reference embodiment except for the light emitting semiconductor element, and some descriptions may be omitted.

In the semiconductor device, silver or silver oxide 720 provided on a surface of a base 700 and silver or silver oxide 340 provided on a surface of a light emitting semiconductor element 300 are bonded.

The light emitting semiconductor element 300 includes a translucent inorganic substrate 310, a semiconductor layer 320 that emits light, an electrode 330 disposed on the semiconductor layer 320, and silver or silver oxide 340 provided on the electrode 330. In the semiconductor layer 320, an n-type semiconductor layer 321 is stacked on the translucent inorganic substrate 310 and a p-type semiconductor layer 322 is stacked on the n-type semiconductor layer 321. In the electrode 330, an n-type electrode 331 is disposed on the n-type semiconductor layer 321, and a p-type electrode 332 is disposed on the p-type semiconductor layer 322. The light emitting semiconductor element 300 employs a face down structure that has the n-type electrode 331 and the p-type electrode 332 on the same side opposite to the translucent substrate 310 and is mounted such that electrodes are under the translucent inorganic substrate 310. The n-type electrode 331 and the p-type electrode 332 are both provided on their surfaces with silver or silver oxide 340. It is preferable that the silver or silver oxide 340 covers the entire surfaces of the n-type electrode 331 and the p-type electrode 332, but the silver or silver oxide layer 340 may be applied only to the portion that is brought into contact with the base 700. One or more layers of the silver or silver oxide 340 may be provided on a surface of the light emitting semiconductor element 300. Moreover, the thickness of the silver or silver oxide 340 provided on a surface of the light emitting semiconductor element 300 is not particularly limited, but preferably is about 0.1 to 50 µm. In order to mount the light emitting semiconductor element 300 facedown, it is preferable to adjust the heights of the n-type electrode 331 and the p-type electrode 332 such that the translucent inorganic substrate 310 is disposed approximately parallel to the base.

In the base 700, a desired circuit pattern is provided on an insulative mount 710, and the silver or silver oxide 720 is provided on the circuit pattern.

In this manner, even for the light emitting semiconductor element 300, which has such a configuration that the n-type electrode 331 and the p-type electrode 332 are disposed on the same side and is mounted facedown, the silver or silver oxide layer 720 provided on the base 700 can be firmly bonded under specific conditions with the silver or silver oxide layer 340 by providing the silver or silver oxide layer 340 on the n-type electrode 331 and the p-type electrode 332. In particular, since no solder bumps are used, bonding can be achieved without creating a short circuit even when the distance between the n-type electrode 331 and the p-type electrode 332 is small.

The method for producing the semiconductor device of the third reference embodiment is also nearly the same as the method for producing the semiconductor device of the first reference embodiment except that no step of wire connection is needed after the bonding of the light emitting semiconductor element 300 and the base 700.

Semiconductor Device of First Embodiment

Figure 4:
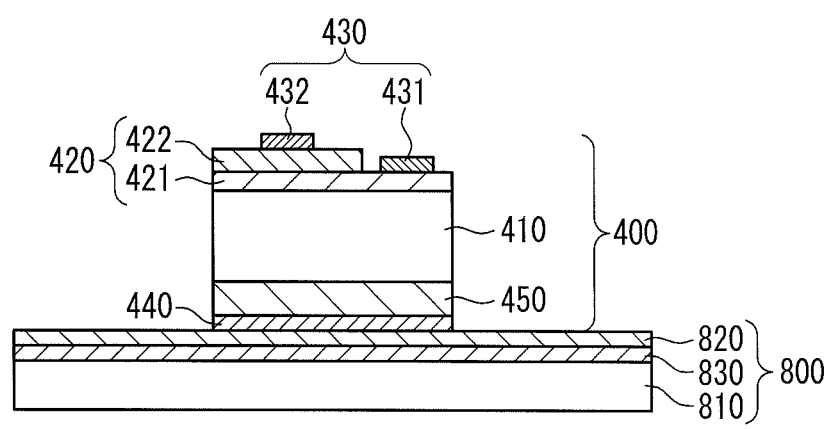
FIG. 4 is a schematic cross-sectional drawing showing the light emitting semiconductor element of the first embodiment when mounted.

An example of the semiconductor device of the first embodiment is described with reference to a drawing. FIG. 4 is a schematic cross-sectional drawing showing the light emitting semiconductor element of the first embodiment when mounted. A description is given with reference to a light emitting semiconductor element that uses a light emitting diode as a semiconductor element, but the present invention is applicable also to transistors, ICs, LSIs, and the like other than light emitting semiconductor elements.

In the semiconductor device, silver 820 provided on a surface of a base 800 and silver 440 provided on a surface of a light emitting semiconductor element 400 are directly bonded.

The light emitting semiconductor element 400 includes a translucent inorganic substrate 410, a semiconductor layer 420 that emits light, electrodes 430 disposed on the semiconductor layer 420, a backing 450 provided on the opposite side to the side on which the semiconductor layer 420 is disposed, and silver 440 provided on a surface of the backing 450. In the semiconductor layer 420, an n-type semiconductor layer 421 is stacked on the translucent inorganic substrate 410 and a p-type semiconductor layer 422 is stacked on the n-type semiconductor layer 421. In the electrode 430, an n-type electrode 431 is disposed on the n-type semiconductor layer 421, and a p-type electrode 432 is disposed on the p-type semiconductor layer 422. The light emitting semiconductor element 400 employs a face-up structure in which the n-type electrode 431 and the p-type electrode 432 are provided on the same side opposite to the translucent inorganic substrate 410 and is mounted such that electrodes are above the translucent inorganic substrate 410. One or more layers of the silver 440 may be provided on the surface of the light emitting semiconductor element 400. Moreover, the thickness of the silver 440 provided on the surface of the light emitting semiconductor element 400 is not particularly limited, but preferably is about 0.1 to 50 μm. It is preferable to provide the backing 450 to bond the silver 440 to the translucent inorganic substrate 410.

The silver 440 may, however, be directly provided on the translucent inorganic substrate 410. Further, the silver 440 does not need to be of a single layer, and may be of multilayers such as two or more layers. The bondability between the silver 440 and the translucent inorganic substrate 410 can be improved by, for example, changing the thickness and material of the silver 440.

In the base 800, a backing 830 is provided on a surface of a pedestal 810, and silver 820 is provided on the backing 830. The pedestal 810 may be conductive or insulative. An example of a conductive member used for the pedestal 810 includes a lead frame made of copper, iron, or a like material. If silver is used for the pedestal 810, it is not necessary to provide the silver 820 and the pedestal 810 serves as the base 800.

On the other hand, examples of an insulative member used for the pedestal 810 include a glass epoxy board, a resin component such as polyphthalamide or a liquid-crystal polymer, a ceramics component, and a like material. In the case where such an insulative member is used for the pedestal 810, desired circuit wiring is installed on a glass epoxy board and the silver 820 is provided on the circuit wiring.

The base 800 can take a variety of shapes such as a flat plate shape and a cup shape. For the ease of mounting the light emitting semiconductor element 400, the base 800 in the shape of a flat plate is preferable. To enhance the efficiency of extracting light from the light emitting semiconductor element 400, the base 800 can take the shape of a cup. In the case where the base 800 is cup-shaped, part of the conductive wiring can be exposed exterior of the base 800 as a terminal. Semiconductor light emitting elements having the same function and semiconductor elements having different functions can be mounted on the base 800. An electronic element such as a resistive element and a capacitor may also be mounted on the base 800.

Wiring with a gold wire or the like is provided on the electrode 430 disposed on the light emitting semiconductor element 400 to attain a desired electrical connection. The light emitting semiconductor element 400 is encapsulated in an encapsulating member that contains a fluorescent material, a filler, a light diffusing member, or the like that absorbs the light emitted from the light emitting semiconductor element 400 and converts the wavelength thereof into a different wavelength, thereby giving a semiconductor device.

Method for Producing Semiconductor Device

The light emitting semiconductor element 400 is mounted on the base 800 such that the silver 440 provided on the surface of the light emitting semiconductor element 400 is brought into contact with the silver 820 provided on the surface of the base 800. No solder, resin, or the like is present between the silver 820 provided on the surface of the base 800 and the silver 440 provided on the surface of the light emitting semiconductor element 400. In the base 800, the pedestal 810 is provided with desired circuit wiring, and the silver 820 is provided on the outermost surface of the circuit wiring. In connection with the positioning of the light emitting semiconductor element 400, the circuit wiring may have various shapes, for example, circuit wiring having a shape identical to the contour of the light emitting semiconductor element 400 can be formed, circuit wiring having a shape slightly smaller than but approximately identical to the contour of the light emitting semiconductor element 400 can be formed, or approximately square circuit wiring whose vertices extend to the four corners of the light emitting semiconductor element 400 can be formed.

The light emitting semiconductor element 400 and the base 800 are bonded by applying to the light emitting semiconductor element 400 and the base 800 heat having a temperature of 200 to 260° C. for 1 to 2 hours. The temperature applied to the light emitting semiconductor element 400 and the base 800 preferably is 240° C. or greater at which strong bonding can be attained. The temperature is not particularly limited insofar as the light emitting semiconductor element 400 can withstand the heat, and it is preferably no greater than 255° C.

Moreover, a temperature of no greater than 250° C., which the light emitting semiconductor element 400 and a packaging can withstand, is particularly preferable. The bonding step can be performed also in air or in an oxygen environment. In the case where the silver 440 is used on the surface of the light emitting semiconductor element 400 and the silver 820 is used on the surface of the base 800, bonding is performed in air or in an oxygen environment. The time needed for boding is 1 to 2 hours, and preferably 1.5 to 2 hours.

Note that, since the melting point of silver is 961° C., heat having a temperature of 200 to 260° C. is applied in the production process, the range of which is significantly lower than the melting point of silver.

After mounting the light emitting semiconductor element 400 on the base 800, wires are connected and encapsulation in an encapsulating member is performed, thereby giving a semiconductor device.

Semiconductor Element

For the semiconductor element, in addition to light emitting semiconductor elements such as light emitting diodes and laser diodes, transistors, ICs, LSIs, Zener diodes, capacitors, light receiving elements, and the like can be used.

In the light emitting semiconductor element, a semiconductor layer is stacked on an inorganic substrate. The inorganic substrate preferably is translucent. Sapphire, GaP, GaN, ITO, ZnO, inorganic glass, ceramics, and the like can be used for the translucent inorganic substrate, and a semiconductor such as GaAlN, ZnS, ZnSe, SiC, GaP, GaAlAs, AlN, InN, AlInGaP, InGaN, GaN, or AlInGaN processed into a light emitting layer is used for the semiconductor layer. The structure of the semiconductor may be a homostructure, a heterostructure, or a double heterostructure, that has an MIS junction, a PIN junction, or a PN junction. Various emission wavelengths, from ultraviolet light to infrared light, can be selected according to the material of the semiconductor layer and the composition of the mixed crystals thereof. The light emitting layer may have a single quantum well structure or a multiple quantum well structure in the form of a thin film that exhibits a quantum effect.

If outdoor use or use in a like environment is considered, a gallium nitride compound semiconductor preferably is used for a semiconductor layer that can form a high-intensity light emitting semiconductor element, and a gallium/aluminium/arsenic semiconductor layer and an aluminium/indium/gallium/phosphorus semiconductor layer preferably are used to create red, and various semiconductors can be used depending on the application.

In the case where a gallium nitride compound semiconductor is used for the semiconductor layer, materials such as sapphire, spinel, SiC, ZnO, and GaN are used for the translucent inorganic substrate. It is preferable to use sapphire for the translucent inorganic substrate to produce highly crystalline gallium nitride that can easily be mass produced. In the case where the light emitting semiconductor element is used facedown, the translucent inorganic substrate is required to have high translucency.

Although the electrode preferably is of a material that does not block light, a light blocking material can also be used. In the case where the light emitting semiconductor element is provided with an n-type electrode and a p-type electrode on the same side, it is preferable that the p-type electrode is provided to occupy a large area of the semiconductor layer.

In the case where the light emitting semiconductor element is provided with an n-type electrode and a p-type electrode on the upper and lower surfaces, it is preferable that the electrode on the side that is brought into contact with the base is provided so as to occupy a large area, and it is particularly preferable that the electrode is provided so as to occupy nearly the entire lower surface. The electrode on the side that is brought into contact with the base preferably is covered with silver.

The translucent p-type electrode may be formed as a thin film having a thickness of 150 μm or less. Moreover, non-metal materials such as ITO and ZnO can also be used for the p-type electrode. Here, in place of the translucent p-type electrode, an electrode that has a plurality of openings for light extraction, such as a mesh electrode, may be used.

In addition to a linear shape, the electrode may take, for example, a curved, whisker, comb, lattice, branch, hook, or network shape. The light blocking effect is increased proportional to the total area of the p-type electrode, it is thus preferable to design the line width and length of an extended conductive part such that the light emission enhancing effect is not overwhelmed by the light blocking effect. Metals such as Au and Au—Sn as well as non-metal materials such as ITO and ZnO can be used for the p-type electrode. In place of the translucent p-type electrode, an electrode that has a plurality of openings for light extraction, such as a mesh electrode, may be used. The size of the light emitting semiconductor element may be suitably selected.

The buffering member of the light emitting semiconductor element preferably contains at least one inorganic material, other than silver, selected from the group consisting of gold, copper, aluminium, tin, cobalt, iron, indium, tungsten and like metals as well as alloys thereof, silica, alumina, zirconium oxide, titanium oxide, and like oxides; and aluminium nitride, zirconium nitride, titanium nitride, and like nitrides. The buffering member of the light emitting semiconductor element preferably contains at least one organic material selected from the group consisting of an epoxy resin, a silicone resin, a modified silicone resin, a polyimide resin, and like insulative resins; and conductive resins that are produced by filling such insulative resins with large amounts of metal powder.

Base

In the base, silver is provided on a surface of the pedestal. A ceramic substrate containing aluminium oxide, aluminium nitride, zirconium oxide, zirconium nitride, titanium oxide, titanium nitride, or a mixture of these, a metal substrate containing Cu, Fe, Ni, Cr, Al, Ag, Au, Ti, or an alloy of these, a lead frame, a glass epoxy board, a BT resin substrate, a glass substrate, a resin substrate, paper, and the like can be used for the base. An example of the lead frame is a metal frame formed from copper, iron, nickel, chromium, aluminium, silver, gold, titanium, or an alloy of these, and a metal frame formed from copper, iron, or an alloy of these is preferable. More preferably, the lead frame is of a copper alloy in the case of a semiconductor device that needs to have heat releasability, and of an iron alloy in the case of a semiconductor device in which the semiconductor element needs to be reliably bonded.

The surface of the wiring board or the lead frame may be coated with silver, silver oxide, silver alloy, silver alloy oxide, Pt, Pt alloy, Sn, Sn alloy, gold, gold alloy, Cu, Cu alloy, Rh, Rh alloy, or the like, and the outermost surface of the portion on which the semiconductor element is to be mounted is coated with silver. Coating with such materials can be performed by plating, vapor deposition, sputtering, printing, applying, or a like technique.

A resin package may be used for the base. A package in which a lead is molded integrally and a package in which circuit wiring is created by plating or a like technique after package molding may be usable. The package can take a variety of shapes such as a cup shape and a flat plate shape. An electrically insulative resin that has excellent light resistance and heat resistance is suitably used for the resin that forms the package and, for example, a thermoplastic resin such as polyphthalamide, a thermosetting resin such as an epoxy resin, glass epoxy, and ceramics can be used. Moreover, to efficiently reflect the light emitted from the light emitting semiconductor element, a white pigment such as titanium oxide can be added to such resins. Usable methods of package molding include insert molding in which a lead is placed in advance in a metal mold, injection molding, extrusion molding, transfer molding, and the like.

Organic Solvent

The organic solvent may be any organic solvent insofar as it can fasten the semiconductor element at ordinary temperatures and the residue of which does not remain after heat bonding. The boiling point of the organic solvent preferably is 100 to 300° C. and can be selected according to the heating temperature during bonding. For example, at least one member can be selected from the following group: lower and higher alcohols containing an alkyl group having 2 to 10 carbon atoms (20 carbon atoms) and 1 to 3 hydroxyl groups (e.g., lower alcohols such as n-butanol, i-butanol, sec-butanol, t-butanol, n-pentanol, i-pentanol, sec-pentanol, t-pentanol, 2-methyl butanol, n-hexanol, 1-methyl pentanol, 2-methyl pentanol, 3-methyl pentanol, 4-methyl pentanol, 1-ethyl butanol, 2-ethyl butanol, 1,1-dimethylbutanol, 2,2-dimethylbutanol, 3,3-dimethylbutanol, 1-ethyl-1-methylpropanol, and the like, and higher alcohols such as nonanol, decanol, and the like); 2-ethyl-1,3-hexanediol, glycerol, ethylene glycol, diethylene glycol, diethylene glycol monobutyl ether, diethylene glycol monoethyl ether, triethylene glycol; hydrocarbon solvents and aliphatic solvents having 8 to 20 carbon atoms (e.g., n-heptane, n-octane, n-nonane, n-decane, n-tetradecane, and the like); solvents containing a carboxyl group and an alkoxyl group (e.g., isopentyl acetate, 2-ethylhexyl acetate, ethyl propionate, and the like); aromatic solvents (e.g., toluene, xylene, anisole, phenol, aniline, monochlorobenzene, dichlorobenzene, and the like); dimethyl sulfoxide (DMSO), N,N-dimethylformamide (DMF), and the like. The organic solvent is preferably at least one selected from the group consisting of 2-ethyl-1,3-hexanediol, glycerin, ethylene glycol, diethylene glycol, diethylene glycol monobutyl ether, diethylene glycol monoethyl ether, and triethylene glycol.

An oxidizing gas such as oxygen, hydrogen peroxide, or ozone that is completely volatilized and does not remain by heating may be dissolved in the organic solvent or water. Thereby, the formation of silver oxide and the acceleration of bonding can be expected. Moreover, fine particles having such a particle diameter that the particles do not serve as a spacer can also be added. Thereby, an enhancement of bonding strength can be expected.

Encapsulating Member

An encapsulating member is used to protect the semiconductor device mounted on the base from external forces, dust, etc. Also, the encapsulating member can let the light emitted from the light emitting semiconductor element efficiently pass through outwardly. Examples of resins used for the encapsulating member include an epoxy resin, a phenolic resin, an acrylic resin, a polyimide resin, a silicone resin, a urethane resin, a thermoplastic resin, and the like. In particular, a silicone resin is preferable since a long-lasting semiconductor device that has excellent heat resistance and light resistance can be produced. For an airtight cover or a non-airtight cover, inorganic glass, a polyacrylic resin, a polycarbonate resin, a polyolefin resin, a polynorbornene resin, and the like can be mentioned. In particular, inorganic glass is preferable since a long-lasting semiconductor device that has excellent heat resistance and light resistance can be produced.

Others

The encapsulating member may contain a fluorescent material, a filler, a light diffusing member, and the like. The fluorescent material may be any material that absorbs the light emitted from the light emitting semiconductor element and emits a fluorescence having a wavelength different from that of the light, and preferably is at least one member selected from a nitride phosphor or an oxynitride phosphor that is activated primarily by a lanthanoid element such as Eu or Ce; an alkaline earth halogen apatite phosphor, a halogenated alkaline earth metal borate phosphor, an alkaline earth metal aluminate phosphor, an alkaline earth silicate phosphor, an alkaline earth sulfide phosphor, an alkaline earth thiogallate phosphor, an alkaline earth silicon nitride phosphor, and a germanate phosphor that are activated primarily by a lanthanoid element such as Eu or a transition metal element such as Mn; a rare earth aluminate phosphor and a rare earth silicate phosphor that are activated primarily by a lanthanoid element such as Ce; and organic and organic complexes that are activated primarily by a lanthanoid element such as Eu; and the like. More preferably, $(Y, Gd)_3(Al, Ga)_5O_{12}$:Ce, $(Ca, Sr, Ba)_2SiO_4$:Eu, $(Ca, Sr)_2Si_5N_8$:Eu, $CaAlSiN_3$:Eu, and the like are used.

For the filler, alumina, silica, tin oxide, zinc oxide, titanium oxide, magnesium oxide, silicon nitride, boron nitride, aluminium nitride, potassium titanate, mica, calcium silicate, magnesium sulfate, barium sulfate, aluminium borate, glass flake, and glass fiber can be used. In addition, silicone rubber particles and silicone elastomer particles can be used for stress relaxation. The light transmittance is greatly influenced by the diameter of the filler particles, and the average particle diameter preferably is 5 µm or greater, but nanoparticles can also be used. It is thus possible to greatly enhance the translucency and light dispersibility of the encapsulating member.

For the light diffusing member, alumina, silica, tin oxide, zinc oxide, titanium oxide, magnesium oxide, silicon nitride, boron nitride, aluminium nitride, potassium titanate, mica, calcium silicate, magnesium sulfate, barium sulfate, aluminium borate, glass flake, and glass fiber can be used. In addition, particles of thermosetting resins such as an epoxy resin, a silicone resin, a benzoguanine resin, and a melamine resin can be used. The light diffusibility is greatly influenced by the diameter of the filler particles, and the average particle diameter preferably is in a range of 0.1 to 5 µm. It is thereby possible to attain light diffusion with a smaller amount of light diffusing member.

The semiconductor element can be coated with the fluorescent material, the filler, and the light diffusing member also by printing, potting, electrodeposition, and stamping. The encapsulating member can be applied to the upper surface thereof. This makes optical design easy in the case where the encapsulating member has a lens shape and enables a high-quality semiconductor device to be obtained.

EXAMPLES

Below, the semiconductor device and the production method therefor of the present invention will be described by way of examples. The semiconductor devices of Reference Examples E1 to E8 are encompassed within the semiconductor device of the first reference embodiment, and some descriptions may therefore be omitted.

Reference Example E1

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

An organic solvent diethylene glycol monobutyl ether was applied to the silver 520 of the base 500, and mounting was performed such that the silver 140 of the light emitting semiconductor element 100 was directly in contact therewith. Bonding was performed as follows: after mounting the light emitting semiconductor element 100 the base 500 was heated in air at about 200° C. for about 3 hours. It was thus possible to directly bond the light emitting semiconductor element 100 and the base 500.

Reference Example E2

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

An organic solvent diethylene glycol monobutyl ether was applied to the silver 520 of the base 500, and mounting was performed such that the silver 140 of the light emitting semiconductor element 100 was directly in contact therewith. Bonding was performed as follows: after mounting the light emitting semiconductor element 100 the base 500 was heated in air at about 350° C. for about 30 minutes. It was thus possible to directly bond the light emitting semiconductor element 100 and the base 500.

Reference Example E3

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

An organic solvent diethylene glycol monobutyl ether was applied to the silver 520 of the base 500, and mounting was performed such that the silver 140 of the light emitting semiconductor element 100 was directly in contact therewith. Bonding was performed as follows: after mounting the light emitting semiconductor element 100 the base 500 was heated in air at about 200° C. for about 20 hours. It was thus possible to directly bond the light emitting semiconductor element 100 and the base 500.

Reference Example E4

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

An organic solvent diethylene glycol monobutyl ether was applied to the silver 520 of the base 500, and mounting was performed such that the silver 140 of the light emitting semiconductor element 100 was directly in contact therewith. Bonding was performed as follows: after mounting the light emitting semiconductor element 100 the base 500 was heated in air at about 350° C. for about 1 hour. It was thus possible to directly bond the light emitting semiconductor element 100 and the base 500.

Reference Example E5

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

An organic solvent diethylene glycol monobutyl ether was applied to the silver 520 of the base 500, and mounting was performed such that the silver oxide 140 of the light emitting semiconductor element 100 was directly in contact therewith. Bonding was performed as follows: after mounting the light emitting semiconductor element 100 the base 500 was heated in a nitrogen stream at about 200° C. for about 4 hours. It was thus possible to directly bond the light emitting semiconductor element 100 and the base 500.

Reference Example E6

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

An organic solvent diethylene glycol monobutyl ether was applied to the silver 520 of the base 500, and mounting was performed such that the silver oxide 140 of the light emitting semiconductor element 100 was directly in contact therewith. Bonding was performed as follows: after mounting the light emitting semiconductor element 100 the base 500 was heated in a nitrogen stream at about 350° C. for about 1 hour. It was thus possible to directly bond the light emitting semiconductor element 100 and the base 500.

Reference Example E7

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

An organic solvent diethylene glycol monobutyl ether was applied to the silver 520 of the base 500, and mounting was performed such that the silver oxide 140 of the light emitting semiconductor element 100 was directly in contact therewith. Bonding was performed as follows: after mounting the light emitting semiconductor element 100 the base 500 was heated in a nitrogen stream at about 200° C. for about 24 hours. It was thus possible to directly bond the light emitting semiconductor element 100 and the base 500.

Reference Example E8

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver oxide 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

An organic solvent diethylene glycol monobutyl ether was applied to the silver 520 of the base 500, and mounting was performed such that the silver oxide 140 of the light emitting semiconductor element 100 was directly in contact therewith. Bonding was performed as follows: after mounting the light emitting semiconductor element 100 the base 500 was heated in a nitrogen stream at about 350° C. for about 2 hours. It was thus possible to directly bond the light emitting semiconductor element 100 and the base 500.

Reference Example R1

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

An organic solvent diethylene glycol monobutyl ether was applied to the silver 520 of the base 500, and mounting was performed such that the silver 140 of the light emitting semiconductor element 100 was directly in contact therewith. Bonding was performed as follows: after mounting the light emitting semiconductor element 100 the base 500 was heated in a nitrogen stream at about 190° C. for about 24 hours. It was thus possible to directly bond the light emitting semiconductor element 100 and the base 500.

Results of Measurement

The die shear strength of the semiconductor devices of Reference Examples E1 to E8 and R1 was measured. For the measurement of die shear strength, a shearing force was applied at room temperature in a direction stripping the light emitting semiconductor element 100 off the base 500, and the intensity of the force when the light emitting semiconductor element 100 was stripped off was determined. The results of the die shear strength (gf) measurement are presented in Table 1.

TABLE 1

| Reference Examples | Die shear strength (gf) |
| --- | --- |
| Reference Example E1 | 602.5 |
| Reference Example E2 | 525.3 |
| Reference Example E3 | 501.2 |
| Reference Example E4 | 513.2 |
| Reference Example E5 | 511.5 |
| Reference Example E6 | 542.3 |
| Reference Example E7 | 518.4 |
| Reference Example E8 | 580.6 |
| Reference Example R1 | 384.5 |

According to the results of the measurement, it was found that the higher the temperature of the bonding, the shorter the time taken to attain the desired die shear strength. It was found that a practical die shear strength can be obtained by selecting a temperature of 200° C. or greater and a suitable heating time. Although the temperature of 350° C. was employed in view of the heat resistance of the package and the light emitting semiconductor element, higher temperatures can be employed when a package and a semiconductor element of greater heat resistance are used. It was found that bonding can be accomplished in a nitrogen stream by providing silver oxide on the light emitting semiconductor element side. Although not presented as Reference Example E, bonding can be similarly accomplished in a nitrogen stream in a semiconductor device in which silver oxide is provided on the base side.

On the other hand, although bonding was accomplished at a heating temperature of 190° C. in Reference Example R1, the die shear strength was not sufficient.

Note that, because of the difference between the thermal conductivities and other properties of the ceramics component used for the base and the epoxy resin, the time taken to achieve the desired die shear strength may sometimes be different even when the same temperature is applied.

Initial Properties

Reference Example C1

Bonding was performed using the same components as in Reference Example E3 except that a clear colorless insulative epoxy resin was used as a die bonding component in Reference Example C1. Curing was performed at 170° C. for 1 hour. The die shear strength attained in Reference Example C1 was about 900 gf.

Reference Example C2

Bonding was performed using the same components as in Reference Example E3 except that a silver paste containing 80 wt % of a flaky silver filler and 20 wt % of an epoxy resin was used in Reference Example C2. Curing was performed at 150° C. for 1 hour. The die shear strength attained in Reference Example C2 was about 1500 gf.

Results of Measurement

In connection with each of Reference Examples E3, C1 and C2, the electrode of the light emitting semiconductor element and the electrode of the base were gold-wired and encapsulated in a silicone resin, thereby giving a semiconductor device. The emission intensity of each semiconductor device as-is was measured. The emission intensity is presented as a value relative to the intensity obtained in Reference Example E3 being 100%. Table 2 shows the results of measurement.

TABLE 2

| | Bonding | Relative intensity of emission (%) |
|---|---|---|
| Ref. Ex. E3 | Direct Ag bonding | 100 |
| Ref. Ex. C1 | Bonding with insulative epoxy resin | 94 |
| Ref. Ex. C2 | Bonding with flaky silver filler-containing epoxy resin | 84 |

As can be understood from the results of measurement, a semiconductor device that had the highest emission intensity was obtained from Reference Example E3. It can be presumed that the emission intensity was lower in Reference Example C1 because the insulative epoxy resin formed a fillet and, in addition, the color of the epoxy resin turned slightly yellow when cured. Similarly, it can be presumed that the intensity of emission was much lower in Reference Example C2 because the flaky silver filler-containing epoxy resin formed a fillet and, in addition, the color of the epoxy resin turned slightly yellow when cured and, simultaneously, light scattering due to the flaky silver filler occurred.

Power-On Test

An electric current was applied to the semiconductor devices of Reference Examples E3, C1 and C2 as-is (test conditions: 25° C. and 50 mA) for 500 hours, 1000 hours, and 2000 hours, and the emission intensity was then measured. Table 3 shows the intensity relative to the initial intensity.

TABLE 3

| | Bonding | After 500 hours | After 1000 hours | After 2000 hours |
|---|---|---|---|---|
| Ref. Ex. E3 | Direct Ag bonding | 100% | 99% | 99% |
| Ref. Ex. C1 | Bonding with insulative epoxy resin | 95% | 80% | 60% |
| Ref. Ex. C2 | Bonding with flaky silver filler-containing epoxy resin | 93% | 75% | 60% |

It was demonstrated that the semiconductor device obtained in Reference Example E3 can maintain high emission intensity even after 2000 hours. On the other hand, it was demonstrated that the semiconductor devices obtained in Reference Examples C1 and C2 exhibited severely impaired intensity after 2000 hours.

Furthermore, it was demonstrated that no discoloration can be observed in the periphery of the light emitting semiconductor element of Reference Example E3 even after 2000 hours. On the other hand, it was demonstrated that the color of the clear colorless insulative epoxy resin of Reference Example C1 disposed for bonding between the light emitting semiconductor element and the base as well as the fillet portions was dark reddish brown after 2000 hours. Moreover, it was demonstrated that the color of the silver paste containing 80 wt % of a flaky silver filler and 20 wt % of an epoxy resin of Reference Example C2 disposed for bonding between the light emitting semiconductor element and the base as well as the fillet portions was dark reddish brown after 2000 hours.

Reference Example E9

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

The light emitting semiconductor element 100 was mounted such that the silver 140 thereof was directly in contact with the silver 520 of the base 500. For this mounting, the lead frame was preheated to about 250° C. in air, and the light emitting semiconductor element 100 was mounted on the base 500. Bonding was performed as follows: the base 500 on which the light emitting semiconductor element 100 was mounted was heated in air at about 350° C. for about 10 minutes. It was thus possible to directly bond the semiconductor light emitting element 100 and the base 500 in a short time.

Reference Example E10

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

An organic solvent diethylene glycol monobutyl ether was applied to the silver 520 of the base 500, and mounting was performed such that the silver 140 of the light emitting semiconductor element 100 was directly in contact therewith. Bonding was performed as follows: after mounting the light emitting semiconductor element 100 the base 500 was heated at about 150° C. for about 30 minutes, then heated at about 200° C. for about 30 minutes, and further heated at about 350° C. for about 1 hour in air. It was thus possible to directly bond the light emitting semiconductor element 100 and the base 500.

Reference Example E11

For a light emitting semiconductor element 100, a translucent inorganic sapphire substrate 110 having the dimensions of 600 μm×600 μm×100 μm (thickness), on the upper surface of which was stacked a semiconductor InGaN layer 120 and the lower layer of which was metallized with silver 140, was used. For a base 500, a cup-shaped alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a cup, providing an underlying metal thereon, sintering the alumina ceramics, and silver-plating the surface of the underlying metal of the sintered alumina ceramics.

An organic solvent diethylene glycol monobutyl ether was applied to the silver 520 of the base 500, and mounting was performed such that the silver 140 of the light emitting semiconductor element 100 was directly in contact therewith. Bonding was performed as follows: after mounting the light emitting semiconductor element 100 the base 500 was heated in air at about 420° C. for about 15 minutes. It was thus possible to directly bond the light emitting semiconductor element 100 and the base 500.

Reference Example E12

For a semiconductor device 100, a Zener diode was used in place of a semiconductor light emitting element. For the semiconductor element 100, an Si substrate 110 having a dimension of 300 μm×300 μm×200 μm (thickness), on the upper surface of which was formed a semiconductor layer 120 and the lower layer of which was metallized with silver 140, was used. For a base 500, a cup-shaped package was formed as a pedestal 510, and silver 520 with which the surface of a lead frame exposed on the outside of the package was silver-plated was used. The package was formed by arranging a lead frame that used copper as a primary component on an epoxy resin in which a white pigment was dispersed and subjecting it to insert molding.

An organic solvent diethylene glycol monobutyl ether was applied to the silver 520 of the base 500, and mounting was performed such that the silver 140 of the semiconductor element 100 was directly in contact therewith. Bonding was performed as follows: after mounting the semiconductor element 100 the base 500 was heated in air at about 300° C. for about 1 hour. It was thus possible to directly bond the semiconductor element 100 and the base 500. Use of a light emitting diode and a Zener diode in one package allows them to be permanently bonded simultaneously after accomplishing the temporary bonding of the light emitting diode and the temporary bonding of the Zener diode, and it was thus possible to simplify the production process.

Reference Example E13

For a semiconductor device 100, an IC chip was used in place of a light emitting semiconductor element. For the semiconductor element 100, an inorganic Si substrate 110 having the dimensions of 300 μm×300 μm×200 μm (thickness), on the upper surface of which was formed a semiconductor layer 120 and the lower layer of which was metallized with silver 140, was used. For a base 500, a plate-shape alumina ceramics substrate was formed as a pedestal 510, and silver 520 with which the surface of an underlying metal disposed on the alumina ceramics substrate was silver-plated was used. The alumina ceramics substrate was formed by stacking alumina ceramics in the shape of a plate, providing an underlying metal thereon, sintering the alumina ceramics, and silver-plating the surface of the underlying metal of the sintered alumina ceramics.

An organic solvent diethylene glycol monobutyl ether was applied to the silver 520 of the base 500, and mounting was performed such that the silver 140 of the semiconductor element 100 was directly in contact therewith. Bonding was performed as follows: after mounting the semiconductor element 100 the base 500 was heated in air at about 350° C. for about 30 minutes. It was thus possible to directly bond the semiconductor element 100 and the base 500.

Example 1

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 200° C. for about 2 hours. It was thus possible to directly bond the light emitting semiconductor element 400 and the base 800.

Example 2

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 220° C. for about 2 hours. It was thus possible to directly bond the light emitting semiconductor element 400 and the base 800.

Example 3

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

Figure 5:
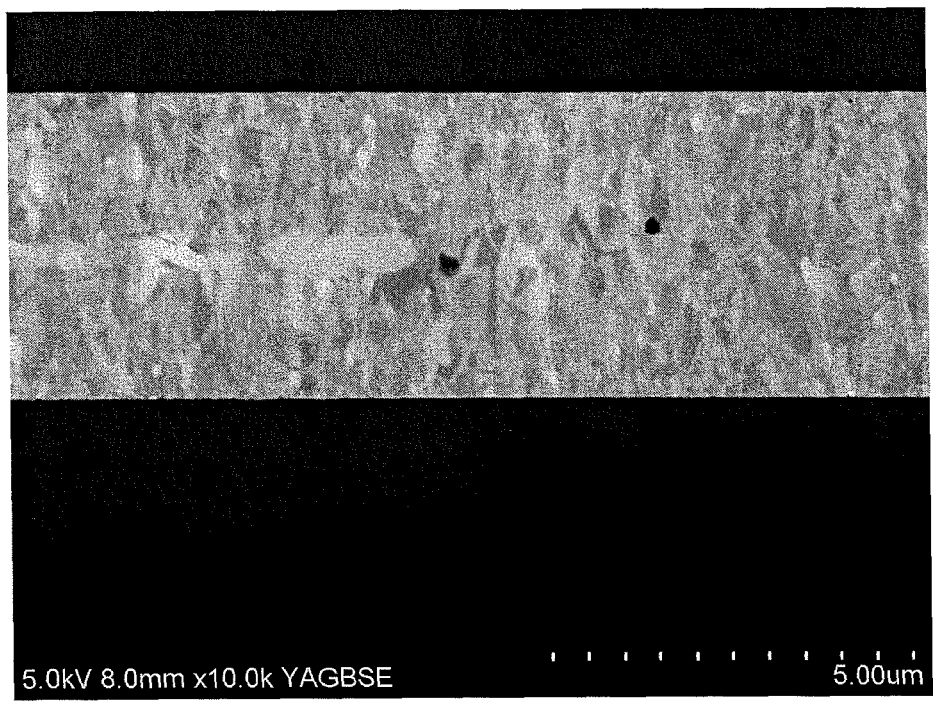
FIG. 5 is a cross-sectional SEM back-scattered electron image of the light emitting semiconductor element of Example 3 when mounted.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 240° C. for about 2 hours. It was thus possible to directly bond the light emitting semiconductor element 400 and the base 800. FIG. 5 is a cross-sectional SEM back-scattered electron image after the bonding.

Example 4

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 260° C. for about 2 hours. It was thus possible to directly bond the light emitting semiconductor element 400 and the base 800.

Comparative Example 1

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 280° C. for about 2 hours. It was thus possible to directly bond the light emitting semiconductor element 400 and the base 800.

Comparative Example 2

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

Figure 6:
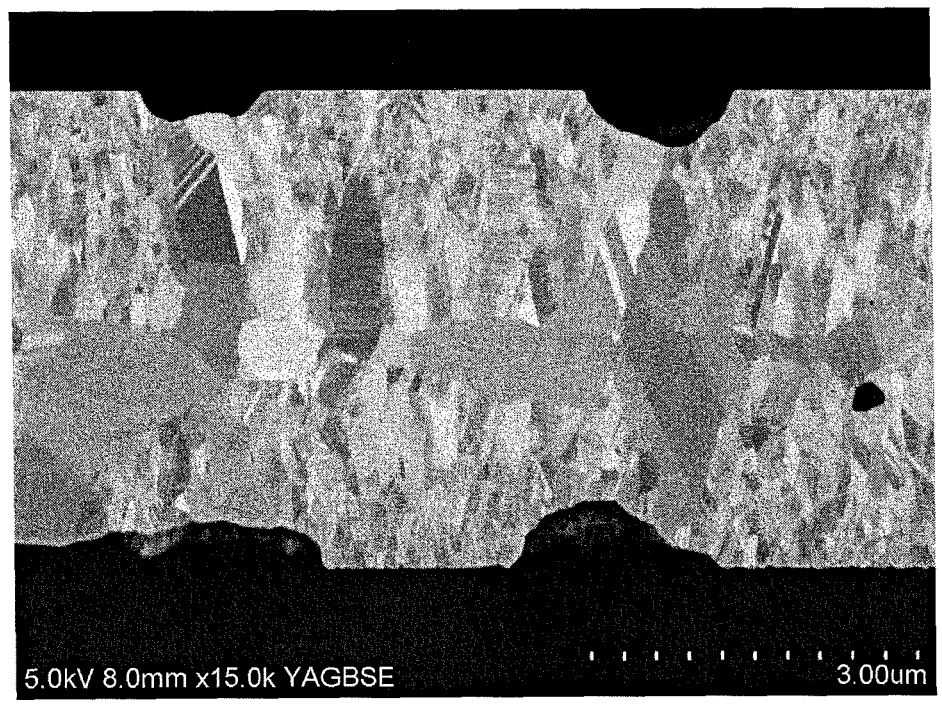
FIG. 6 is a cross-sectional SEM back-scattered electron image of the light emitting semiconductor element of Comparative Example 2 when mounted.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 300° C. for about 2 hours. It was thus possible to directly bond the light emitting semiconductor element 400 and the base 800. FIG. 6 is a cross-sectional SEM back-scattered electron image after the bonding.

Comparative Example 3

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 320° C. for about 2 hours. It was thus possible to directly bond the light emitting semiconductor element 400 and the base 800.

Comparative Example 4

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 340° C. for about 2 hours. It was thus possible to directly bond the light emitting semiconductor element 400 and the base 800.

Comparative Example 5

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 360° C. for about 2 hours. It was thus possible to directly bond the light emitting semiconductor element 400 and the base 800.

Example 5

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

Figure 7:
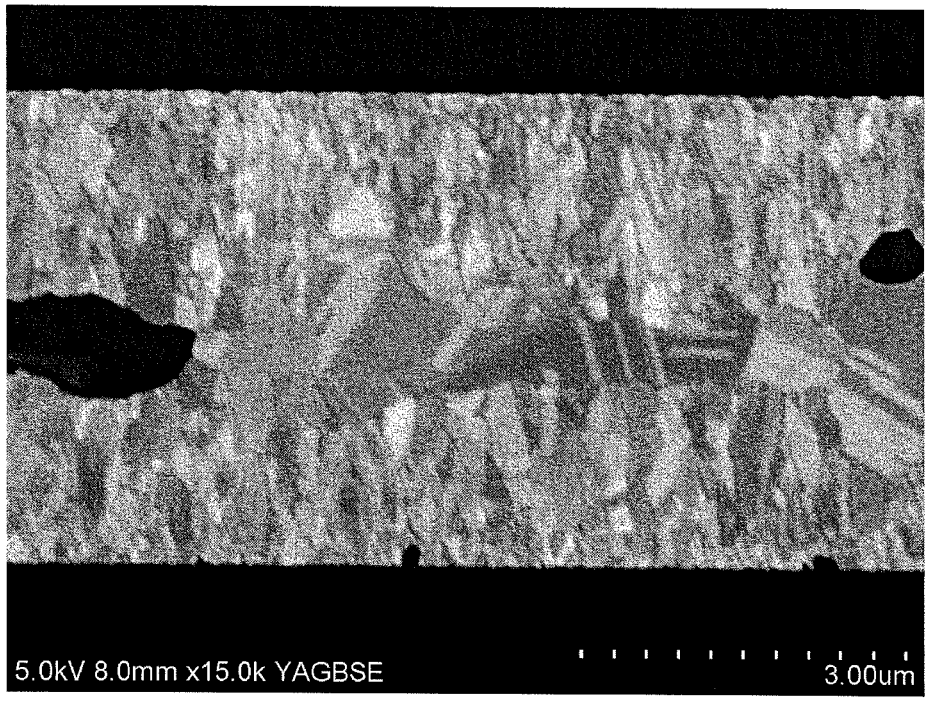
FIG. 7 is a cross-sectional SEM back-scattered electron image of the cross section of the light emitting semiconductor element of Example 5 when mounted.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated in air at about 250° C. for about 2 hours. It was thus possible to directly bond the light emitting semiconductor element 400 and the base 800. FIG. 7 is a cross-sectional SEM back-scattered electron image after the bonding.

Example 6

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

Figure 8:
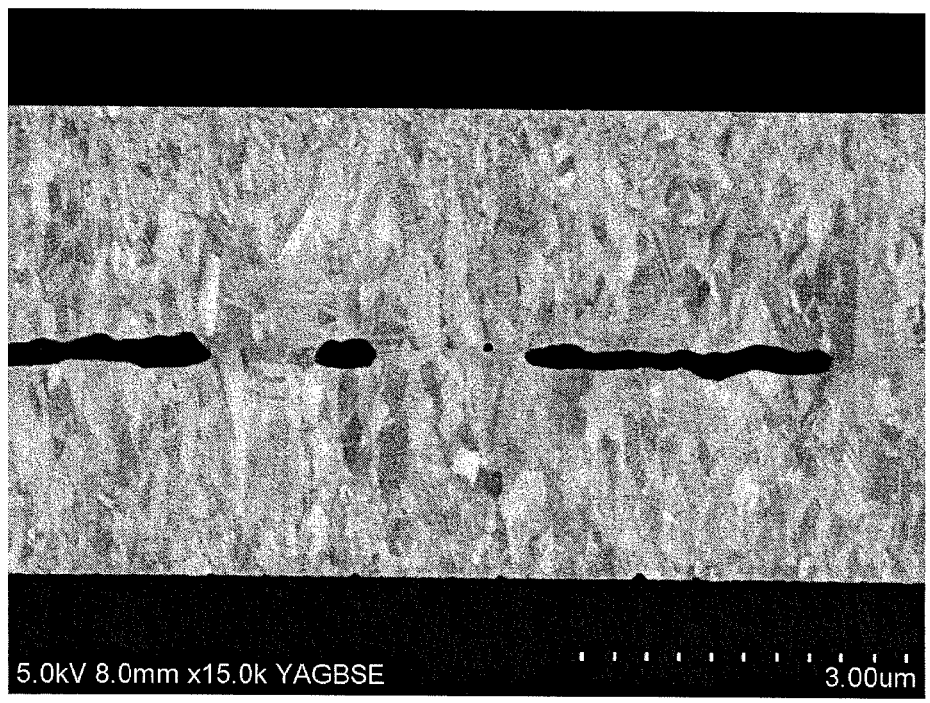
FIG. 8 is a cross-sectional SEM back-scattered electron image of the light emitting semiconductor element of Example 6 when mounted.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated at about 250° C. for about 2 hours in a mixed environment of air and nitrogen having an oxygen concentration of about 2%. It was thus possible to directly bond the light emitting semiconductor element 400 and the base 800. FIG. 8 is a cross-sectional SEM back-scattered electron image after the bonding.

Example 7

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

Figure 9:
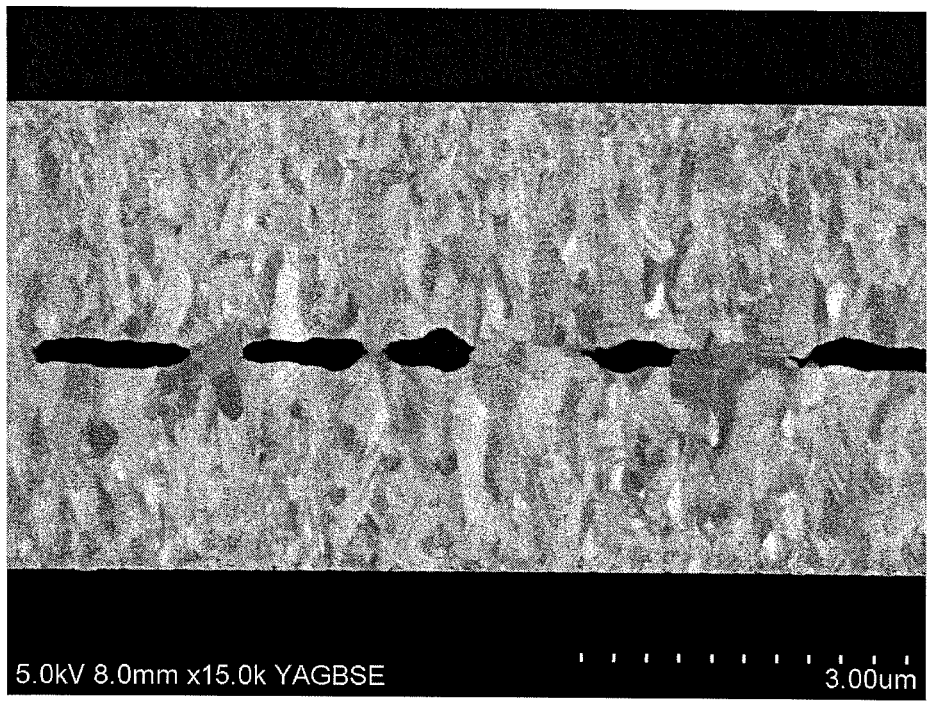
FIG. 9 is a cross-sectional SEM back-scattered electron image of the light emitting semiconductor element of Example 7 when mounted.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated at about 250° C. for about 2 hours in a mixed environment of air and nitrogen having an oxygen concentration of about 1%. It was thus possible to directly bond the light emitting semiconductor element 400 and the base 800. FIG. 9 is a cross-sectional SEM back-scattered electron image after the bonding.

Example 8

For a light emitting semiconductor element 400, a light emitting semiconductor element comprising the following was used: a translucent inorganic sapphire substrate 410 having dimensions of 600 μm×600 μm×120 μm (thickness); a semiconductor InGaN layer 420 stacked on the upper surface of the translucent inorganic sapphire substrate 410; titanium 450 for achieving intimate contact, which was metalized on the lower surface of the translucent inorganic sapphire substrate 410; and silver 440 metalized on the lower surface of the titanium 450. For a base 800, a base comprising the following was used: a glass substrate 810 having dimensions of 25 mm×10 mm×1 mm (thickness); titanium 830 for achieving intimate contact and serving as a backing, which was metalized on the upper surface of the glass substrate 810; and silver 820 metalized in a thickness of 2 μm on the upper surface of the titanium 830.

Figure 10:
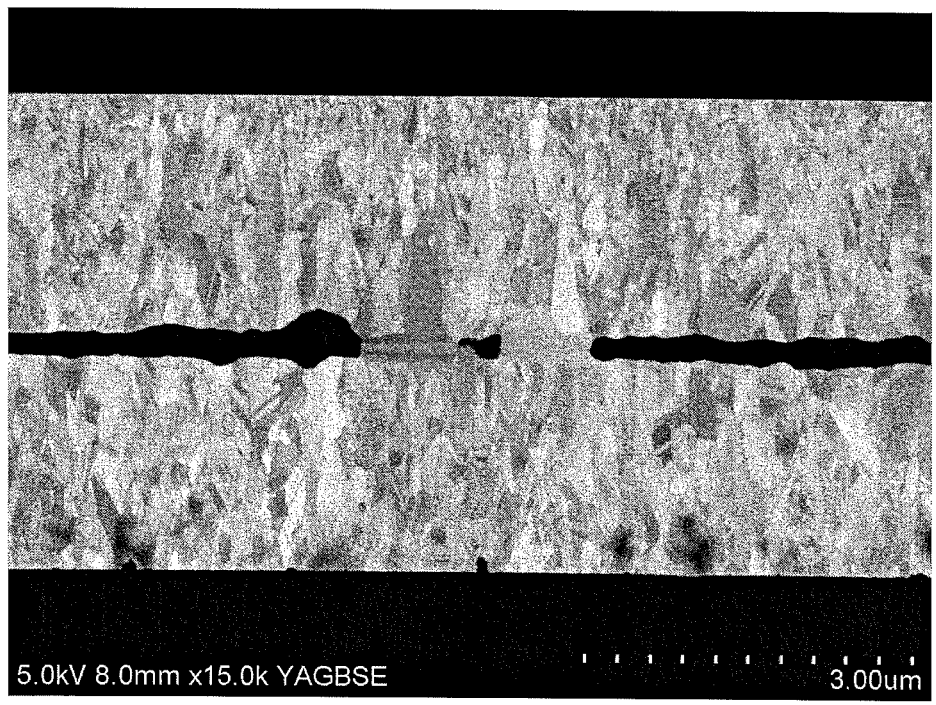
FIG. 10 is a cross-sectional SEM back-scattered electron image of the light emitting semiconductor element of Example 8 when mounted.

An organic solvent 2-ethyl-1,3-hexanediol was applied to the silver 820 of the base 800, and mounting was performed such that the silver 440 of the light emitting semiconductor element 400 was directly in contact therewith. Bonding was performed as follows: after mounting the light emitting semiconductor element 400 the base 800 was heated at about 250° C. for about 2 hours in a mixed environment of air and nitrogen having an oxygen concentration of about 0.5%. It was thus possible to directly bond the light emitting semiconductor element 400 and the base 800. FIG. 10 is a cross-sectional SEM back-scattered electron image after the bonding.

Results of Measurement

The die shear strength of the semiconductor devices of Examples 1 to 8 and Comparative Examples 1 to 5 was measured. For the measurement of die shear strength, a shearing force was applied at room temperature in a direction stripping the light emitting semiconductor element 400 off the base 800, and the intensity of the force when the light emitting semiconductor element 400 was stripped off was determined. Further, for the semiconductor devices of Examples 1 to 4, they were heated in air at 350° C. for about 2 hours to determine their retention of die shear strength before and after the heating. The results of the measured die shear strength and retention of bonding strength after the heat test of the semiconductor devices of Examples 1 to 4 and Comparative Examples 1 to 5 are presented in Table 4. Further, the results of the measured die shear strength of the semiconductor devices of Examples 5 to 8 are presented in Table 5. Further, the total area of voids in the bonded interface between the silver arranged on the semiconductor element and the silver arranged on the base that accounts for of the total area of the bonded interface is also presented in Tables 4 and 5 in percentage terms, where the total area of the bonded interface is 100%. The area in percentage terms was determined by cross-sectional SEM observation of the bonded interface having a width of 20 μm.

TABLE 4

| Examples | Heating temperature (° C.) | Die shear strength (Mpa) | Retention of bonding strength after heat test (%) | Area of voids in bonded interface (%) |
|---|---|---|---|---|
| Ex. 1 | 200 | 47.8 | 44.8 | — |
| Ex. 2 | 220 | 63.6 | 51.9 | — |
| Ex. 3 | 240 | 134.7 | 60.7 | 2.4 |
| Ex. 4 | 260 | 108.9 | 41.1 | — |
| Comp. Ex. 1 | 280 | 84.0 | — | — |
| Comp. Ex. 2 | 300 | 78.3 | — | 1.4 |
| Comp. Ex. 3 | 320 | 44.7 | — | — |
| Comp. Ex. 4 | 340 | 36.5 | — | — |
| Comp. Ex. 5 | 360 | 37.0 | — | — |

TABLE 5

| Examples | Heating temperature (° C.) | Oxygen concentration (%) | Die shear strength (Mpa) | Area of voids in bonded interface (%) |
|---|---|---|---|---|
| Ex. 5 | 250 | 20 | 128.1 | 27.8 |
| Ex. 6 | 250 | 2 | 109.7 | 61.3 |
| Ex. 7 | 250 | 1 | 83.7 | 52.6 |
| Ex. 8 | 250 | 0.5 | 70.0 | 72.9 |

From the results of the measurement, it was demonstrated that excellent die share strength could be achieved when bonding was performed under such conditions that heat having a temperature of 200 to 260° C. was applied for 1 to 2 hours. Furthermore, it was demonstrated that the higher the oxygen concentration the stronger the obtained die share strength would be under the bonding conditions where heating was performed at the same temperature and for the same amount of time.

The method for producing a semiconductor device of the present invention is applicable to, for example, the connection of component electrodes, die attaching, fine-pitch bumping, flat panels, solar wiring and like production applications, and wafer connection and like applications as well as to the production of electronic parts produced by assembling such components. Moreover, the method for producing a semiconductor device of the present invention is applicable when, for example, semiconductor devices that use light emitting semiconductor elements such as LEDs and LDs are produced.

DESCRIPTION OF REFERENCE NUMERALS 100, 200, 300, 400: Light emitting semiconductor element
110, 210, 310, 410: Translucent inorganic substrate
120, 220, 320, 420: Semiconductor layer
121, 221, 321, 421: N-type semiconductor
122, 222, 322, 422: P-type semiconductor
130, 330, 430: Electrode
131, 331, 431: N-type electrode
132, 232, 332, 432: P-type electrode
140, 240, 340: Silver or silver oxide
440: Silver
450: Backing
150, 250: First silver
160, 260: Buffering member
500, 600, 700, 800: Base
510, 610, 710, 810: Pedestal
520, 620, 720: Silver or silver oxide
820: Silver
830: Backing The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device in which:
   a silver coating arranged on a semiconductor element and a silver coating arranged on a base are bonded directly, and
   wherein no void is present or a small void, if any, is present at an interface between the semiconductor element and the silver coating arranged on the semiconductor element, and
   no void is present or a small void, if any, is present at an interface between the base and the silver coating arranged on the base, and
   one or more silver abnormal growth grains and one or more voids are present in a bonded interface between the silver coating arranged on the semiconductor element and the silver coating arranged on the base, wherein
   the semiconductor element is a light emitting semiconductor element,
   the semiconductor element comprises a translucent inorganic substrate, a semiconductor layer formed on the translucent inorganic substrate, and an n-type electrode and a p-type electrode provided on the semiconductor layer,
   the semiconductor element further comprises a titanium backing provided on the opposite side to the side where the semiconductor layer of the translucent inorganic substrate is formed, and
   the silver coating arranged on the semiconductor element is provided on the surface of the backing.

2. The semiconductor device according to claim 1, wherein the total area of the one or more voids in the bonded interface between the silver coating arranged on the semiconductor element and the silver coating arranged on the base is 80% or less of the total area of the bonded interface, where the total area of the bonded interface is 100%.

3. The semiconductor device according to claim 1, wherein
   the base comprises a titanium backing, and
   the silver coating arranged on the base is provided on the backing.

4. The semiconductor device according to claim 1, wherein the translucent inorganic substrate of the semiconductor element comprises a sapphire substrate, and a semiconductor layer of a gallium nitride compound semiconductor is laminated on the sapphire substrate.

5. The semiconductor device according to claim 1, wherein the base is a lead frame comprising a metal frame made of copper, iron, nickel, chrome, aluminum, silver, gold, titanium or an alloy thereof.

6. The semiconductor device according to claim 1, wherein the base is a wiring board comprising a metallic wiring provide on a ceramic substrate containing aluminum oxide, aluminum nitride, zirconium oxide, zirconium nitride, titanium oxide, titanium nitride, or a mixture thereof, a metal substrate containing Cu, Fe, Ni, Cr, Al, Ag, Au, Ti or an alloy thereof, a glass epoxy board, a BT resin substrate, a glass substrate, a resin substrate, or paper.

7. The semiconductor device according to claim 1, wherein
   the semiconductor device is produced by a semiconductor device production method comprising the steps of:
   applying an organic solvent or water between the silver coating provided on the surface of the semiconductor element and the silver coating provided on the surface of the base,
   arranging the semiconductor element on the base such that the silver coating provided on the surface of the semiconductor element is in contact with the silver coating provided on the surface of the base, and
   bonding the semiconductor element and the base by applying heat having a temperature of 200 to 260° C. for 1 to 2 hours to the semiconductor element and the base.

8. The semiconductor device according to claim 7, wherein the organic solvent has a boiling point of 100 to 300° C.

9. The semiconductor device according to claim 8, wherein the organic solvent is at least one member selected from the group consisting of 2-ethyl-1,3-hexanediol, glycerin, ethylene glycol, diethylene glycol, diethylene glycol monobutyl ether, diethylene glycol monoethyl ether, and triethylene glycol.

10. The semiconductor device according to claim 9, wherein the step of bonding is performed in air or in an oxygen environment.

* * * * *